(12) United States Patent
Araki

(10) Patent No.: US 7,637,831 B2
(45) Date of Patent: Dec. 29, 2009

(54) POWER TRANSMISSION MECHANISM OF MODEL VEHICLE

(75) Inventor: Shigeki Araki, Shizuoka (JP)

(73) Assignee: Tamiya, Inc., Shizuoka (JP)

( * ) Notice: Subject to any disclaimer, the term of this patent is extended or adjusted under 35 U.S.C. 154(b) by 418 days.

(21) Appl. No.: 10/587,485

(22) PCT Filed: Jan. 27, 2005

(86) PCT No.: PCT/JP2005/001112

§ 371 (c)(1),
(2), (4) Date: May 9, 2007

(87) PCT Pub. No.: WO2005/078844

PCT Pub. Date: Nov. 8, 2005

(65) Prior Publication Data

US 2008/0039264 A1 Feb. 14, 2008

(30) Foreign Application Priority Data

Jan. 30, 2004 (JP) .............................. 2004-022578

(51) Int. Cl.
*B62D 11/06* (2006.01)
*F16H 48/06* (2006.01)
*B62D 11/00* (2006.01)
*A63H 17/14* (2006.01)

(52) U.S. Cl. .................. 475/28; 475/221; 180/6.44; 446/433

(58) Field of Classification Search ................ 475/5, 475/28, 150, 151, 152, 221, 200, 201; 74/413, 74/665 L, 665 M, 665 N; 180/6.44, 6.48, 180/6.49; 446/237, 433, 454
See application file for complete search history.

(56) References Cited

U.S. PATENT DOCUMENTS

| 3,371,734 A | * | 3/1968 | Zaunberger et al. ........ 180/6.44 |
| 3,601,211 A | * | 8/1971 | Finke ........................ 180/6.66 |
| 3,620,320 A | * | 11/1971 | Armasow .................. 180/6.44 |
| 7,497,796 B2 | * | 3/2009 | Ordo et al. ..................... 475/5 |

FOREIGN PATENT DOCUMENTS

| JP | 11-221370 | 8/1999 |
| JP | 2002-146835 | 5/2002 |
| JP | 2002-306860 | 10/2002 |

* cited by examiner

*Primary Examiner*—Roger Pang
(74) *Attorney, Agent, or Firm*—Wenderoth, Lind & Ponack, L.L.P.

(57) ABSTRACT

A power transmission mechanism of a model vehicle capable of mechanically performing accurate straight running and turning control without relying upon the output characteristic of each drive system in an RC tank having two drive systems. The power transmission mechanism comprises a motor (10) for traveling providing a drive force for traveling, a motor (30) for turning providing a drive force for turning, a left side differential gear (40) and a right side differential gear (50) to which the rotations of the motor (10) for traveling and the motor (30) for turning are transmitted, and a center differential gear (80) to which the rotation of the motor (30) for turning is transmitted. The turning is performed by using the left side differential gear (40), the right side differential gear (50), and the center differential gear (80).

14 Claims, 4 Drawing Sheets

(a)

(b)

POWER TRANSMISSION MECHANISM OF MODEL VEHICLE

TECHNICAL FIELD

The present invention relates to a power transmission mechanism of a model vehicle and, more particularly, to a power transmission mechanism for use in model tracked vehicles (caterpillar vehicles), e.g. tanks, or model vehicles without a steering mechanism.

BACKGROUND ART

A drive mechanism used in a conventional radio-controlled model tank (RC tank) will be explained below. The RC tank has a receiver provided on the vehicle body thereof to receive control signals from a transmitter of a radio control unit. A control part provided on the vehicle body controls left and right motors mounted on the vehicle body on the basis of the received control signals so that the motors are rotated forward or backward and so forth. The left and right motors transmit power to left and right140 caterpillars of the RC tank independently of each other.

FIG. 4 illustrates an RC tank arranged as stated above. A radio control unit 100 has a left lever 101 for outputting control signals for a left motor 105 and a right lever 102 for outputting control signals for a right motor 106. If the left and right levers 101 and 102 are simultaneously actuated forward or backward by the same amount, a control part 104 provided on a vehicle body 103 outputs signals to the left motor 105 and the right motor 106 to rotate them at the same speed. The signals are amplified in amplifiers 105a and 105b to drive the respective motors 105 and 106, thereby causing the RC tank to travel forward or backward. During the forward or backward traveling, if the amount of actuation of one lever is reduced, the rotational speed of the caterpillar rotated by one motor reduces, and the vehicle body turns. The control part 104 on the vehicle body 103 outputs signals to the left motor 105 and the right motor 106 to rotate them at the same speed, and the signals are amplified in the left and right amplifiers 105a and 105b to drive the respective motors.

Meanwhile, as shown in FIG. 5, a radio control unit 200 of a radio-controlled car (RC car) or the like has two control levers, of which a left lever 201 is actuated to perform speed control, and a right lever 202 is used for steering control. This type is common in RC cars. A control part 204 on a vehicle body 203 outputs signals to a motor 205 and a steering servo 206. The signal output to the motor 205 is amplified in an amplifier 205a to drive the motor 205.

Under these circumstances, attempts to make the operation of the remote controller for RC tanks similar to that for RC cars have been proposed, for example, in Patent Document 1 and Patent Document 2 that was presented by this applicant. The RC tanks in these patent documents have left and right motors that are independent of each other in the same way as in the above-described RC tank. The radio control units of these RC tanks, however, have a left lever for throttling and a right lever for steering. A control part processes actuating signals of the left and right levers in a software manner to change the rotational speeds and rotational directions of the left and right motors, thereby controlling turning and forward and backward traveling of the RC tank.

Patent Document 1: Japanese Patent Application Publication No. Hei 11-221370

Patent Document 2: Japanese Patent Application Publication No. 2002-306860

DISCLOSURE OF THE INVENTION

Problem to be Solved by the Invention

In RC tanks such as those disclosed in Patent Documents 1 and 2, however, the left and right drive systems are driven by the left and right motors, which are independent of each other. Therefore, even if the right and left motors are of the same specifications and driven by the same power supply, because each individual motor has different output characteristics due to manufacturing errors, the vehicle may travel while being biased toward one side when supposed to travel in a straight line. In such a case, the operator oneself needs to control the travel of the vehicle in accordance with the deviation of the output characteristics of the left and right motors.

An object of the present invention is to provide a power transmission mechanism of an RC tank having two drive systems that is capable of controlling forward and backward traveling and turning of the vehicle while mechanically performing accurate straight running control independently of the output characteristics of each drive system.

Means for Solving the Problem

To solve the above-described problem, the invention provides a power transmission mechanism 1 for use in a model vehicle (model tank). The power transmission mechanism 1 includes a drive unit (motor for traveling) 10 for traveling providing a drive force for traveling to the model vehicle, a first rotating shaft 35 to which the drive force of the traveling drive unit 10 is transmitted, a first differential gear (left-side differential gear) 40 and a second differential gear (right-side differential gear) 50 to which the rotation of the first rotating shaft 35 is transmitted, a first wheel (left-side sprocket) 61 rotated by the first differential gear 40, a second wheel (right-side wheel) 62 rotated by the second differential gear 50, a drive unit (motor for turning) 30 for turning providing a drive force for turning to the model vehicle, a second rotating shaft (right-side inner rotating shaft) 53 to which the drive force of the turning drive unit 30 is transmitted, a third differential gear (center differential gear) 80 to which the rotation of the second rotating shaft 53 is transmitted, a third rotating shaft (left-side inner rotating shaft) 43 transmitting the rotation transmitted from the third differential gear 80 to the first differential gear 40, and a control part 2 controlling the rotations of the traveling drive unit 10 and the turning drive unit 30. The third differential gear 80 transmits the rotation transmitted from the second rotating shaft 53 to the third rotating shaft 43 through differential rotation. The first differential gear 40 transmits the rotation transmitted from the third rotating shaft 43 to the first wheel 61 through differential rotation. The second rotating shaft 53 transmits the rotation transmitted from the turning drive unit 30 to the second differential gear 50. The second differential gear 50 transmits the rotation transmitted from the second rotating shaft 53 to the second wheel 62 through differential rotation.

According to the invention set forth, when the model vehicle is to travel in a straight line, the control part 2 drives the traveling drive unit 10 and stops the turning drive unit 30.

According to the invention set forth in, when the model vehicle is to make a slow turn, the control part 2 drives the traveling drive unit 10 and, at the same time, drives the turning drive unit 30, thereby producing a difference in the number of revolutions of the left- and right-side wheels 61 and 62.

According to the invention set forth in, when the slow turn is to be made, rotations in the same direction are applied from the traveling drive unit 10 and the turning drive unit 30 to either one of the first differential gear 40 and the second differential gear 50 to increase the number of revolutions of either one of the first wheel 61 and the second wheel 62, and at the same time, rotations in opposite directions to each other are applied from the traveling drive unit 10 and the turning drive unit 30 to the other of the first differential gear 40 and the second differential gear 50 to reduce the number of revolutions of the other of the first wheel 61 and the second wheel 62.

According to the invention set forth, when the model vehicle is to make a pivot turn, the control part 2 drives the traveling drive unit 10 and the turning drive unit 30 at predetermined numbers of revolutions, thereby stopping the rotation of either one of the first wheel 61 and the second wheel 62 and rotating the other of the first wheel 61 and the second wheel 62.

According to the invention set forth, when the pivot turn is to be made, the rotations of the traveling drive unit 10 and the turning drive unit 30 are applied to either one of the first differential gear 40 and the second differential gear 50 at the same number of revolutions but in opposite directions, thereby stopping the rotation of either one of the first wheel 61 and the second wheel 62.

According to the invention set forth, when the model vehicle is to make a spin turn, the control part 2 stops the traveling drive unit 10 and drives the turning drive unit 30, thereby rotating the first wheel 61 and the second wheel 62 in opposite directions.

According to the invention set forth, when the spin turn is to be made, rotation of the turning drive unit 30 is applied to either one of the first differential gear 40 and the second differential gear 50 to rotate either one of the first wheel 61 and the second wheel 62, and at the same time, rotation of the turning drive unit 30 is applied to the other of the first differential gear 40 and the second differential gear 50 at the same number of revolutions as that of the rotation applied to the one of the first and second differential gears 40 and 50 but in the opposite direction to that of the rotation, thereby rotating the other of the first wheel 61 and the second wheel 62 in the opposite direction to that of the rotation of the one of the first wheel 61 and the second wheel 62.

According to the invention set forth, the power transmission mechanism 1 further includes a first speed-reducing mechanism that transmits rotation of the traveling drive unit 10 to the first rotating shaft 35 after reducing the speed of the rotation. According to the invention set forth in claim 10, the power transmission mechanism 1 further includes a second speed-reducing mechanism that transmits rotation of the turning drive unit 30 to the second rotating shaft 53 after reducing the speed of the rotation.

According to the invention set forth, the power transmission mechanism 1 further includes a first rotating shaft left gear 36 that transmits rotation of the first rotating shaft 35 to the first differential gear 40, and a first rotating shaft right gear 37 that transmits rotation of the first rotating shaft 35 to the second differential gear 50.

According to the invention set forth, the power transmission mechanism 1 further includes a first differential gear peripheral gear 41 which is provided on the first differential gear 40 and to which rotation of the first rotating shaft left gear 36 is transmitted, and a second differential gear peripheral gear 51 which is provided on the second differential gear 50 and to which rotation of the first rotating shaft right gear 37 is transmitted. In addition, according to the invention set forth in claim 13, the first wheel 61 rotates in the same direction as the first differential gear peripheral gear 41, and the second wheel 62 rotates in the same direction as the second differential gear peripheral gear 51. In addition, according to the invention set forth, the model vehicle is a tracked vehicle.

EFFECTS OF THE INVENTION

The power transmission mechanism according to the present invention is provided with two drive units having different functions for traveling and turning. Therefore, these drive units need not have the same specifications for two drive systems. Accordingly, it is possible to change the specifications of one of the drive units easily according to use application.

Further, the drive unit for traveling and the drive unit for turning can be controlled independently of each other, and it is possible to control the left and right turning directions and forward and backward traveling speeds of the model vehicle independently of each other by controlling the rotational directions and rotational speeds of the respective drive units without performing complicated control in a software manner as in the conventional practice. Thus, a radio control unit for use in ordinary RC cars can be used for the model vehicle without the need to change the software of the control part to a considerable extent.

Figure 1:
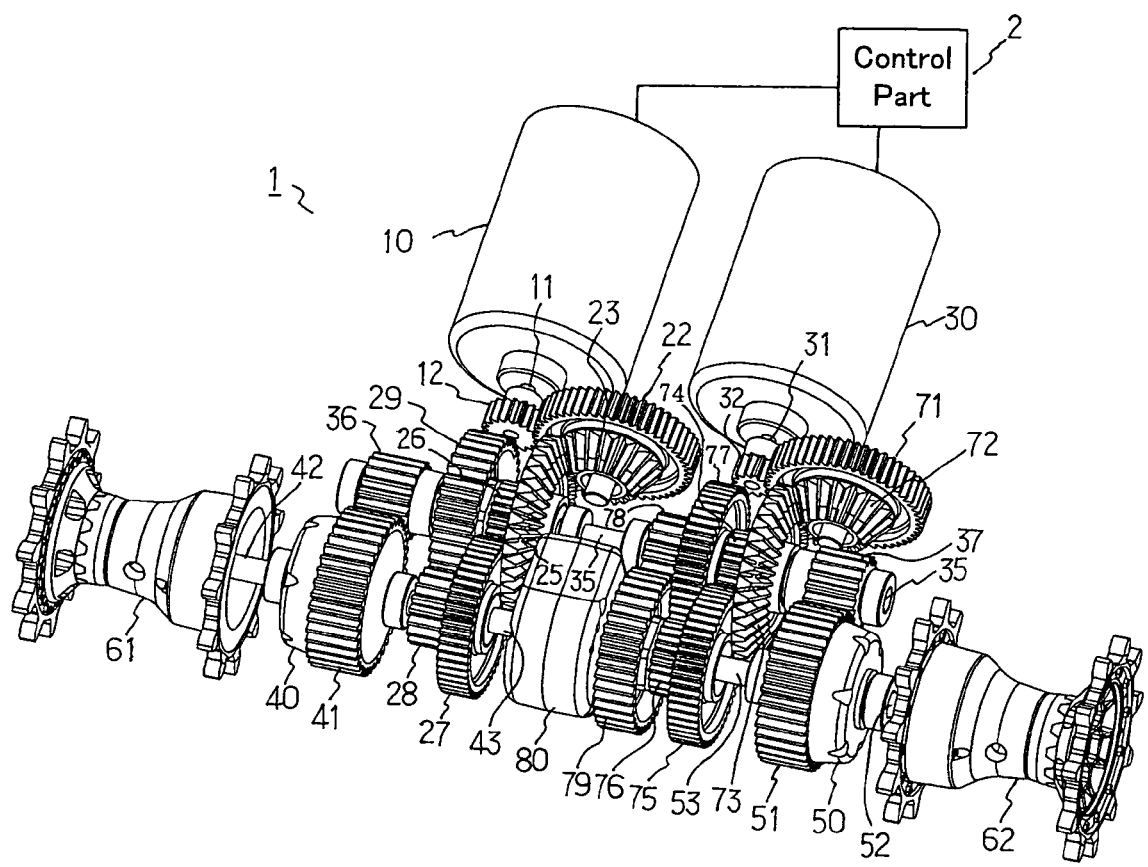
FIG. 1 is a perspective view of a power transmission mechanism according to the present invention.

EXPLANATION OF REFERENCE NUMERALS
  1: power transmission mechanism
  10: motor for traveling
  30: motor for turning
  35: first rotating shaft
  36: first rotating shaft left-end gear
  37: first rotating shaft right-end gear
  40: left differential gear
  41: peripheral gear
  42: left-outer rotating shaft
  43: left-inner rotating shaft
  50: right differential gear
  51: peripheral gear
  52: right-outer rotating shaft
  53: right-inner rotating shaft
  61: left wheel
  62: right wheel
  80: center differential gear

BEST MODE FOR CARRYING OUT THE INVENTION

Figure 2:
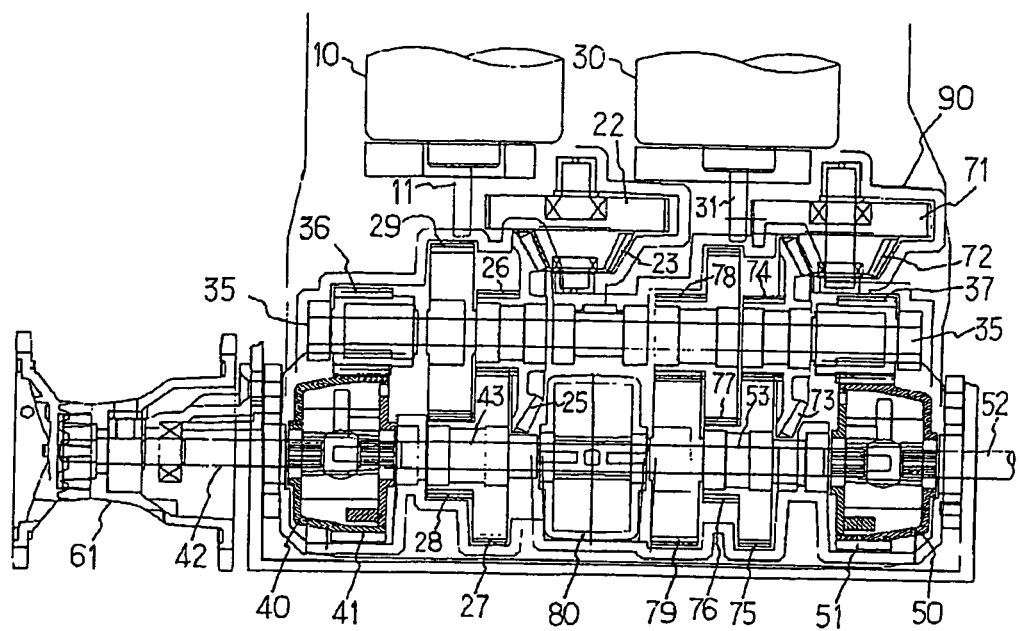
FIG. 2 is a horizontal sectional view of the power transmission mechanism according to the present invention.
Figure 3:
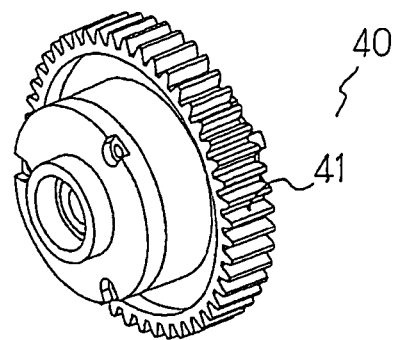
FIG. 3 is a sectional view of a differential gear used in the present invention.
Figure 3:
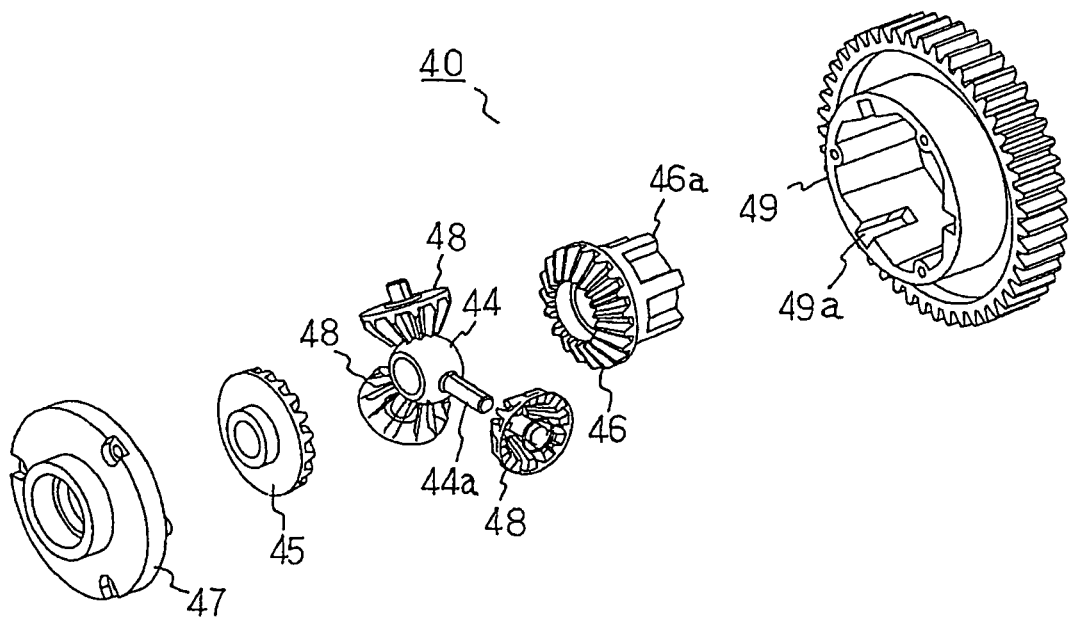
Figure 4:
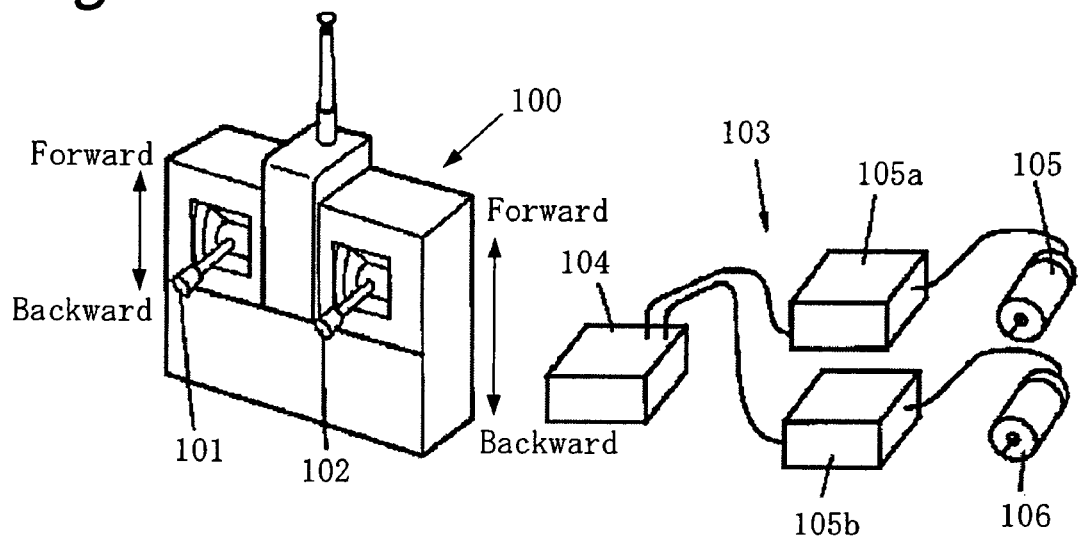
FIG. 4 is a conceptual view showing a conventional RC tank power control.

An embodiment in which a power transmission mechanism according to the present invention is applied to a model tank will be explained with reference to FIGS. 1 to 3. It should be noted that the present invention is not necessarily limited to tanks but may also be applied to any model vehicles other than tanks such as tracked vehicles (caterpillar vehicles) or model vehicles equipped with no steering mechanism.

The power transmission mechanism according to the present invention controls running of a model vehicle by using two motors to perform straight-line travel, slow turn, pivot turn, and spin turn smoothly from low speed to high speed. Basically, the power transmission mechanism employs differential gears that are generally used to adjust the numbers of revolutions of the left and right wheels of an automobile or the like during cornering and controls the rotations of the two motors by combination of the differential gears.

Figure 5:
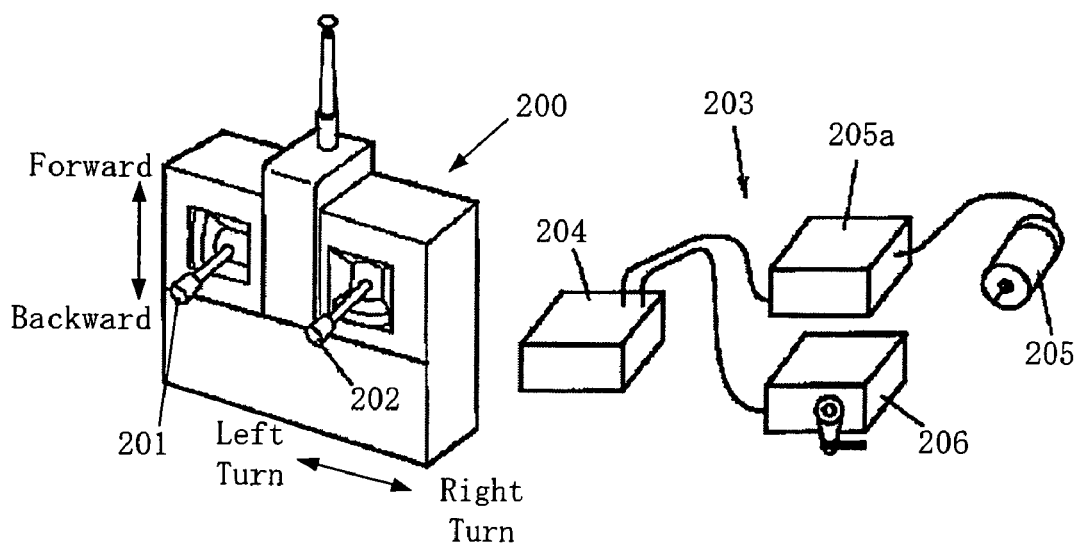
FIG. 5 is a conceptual view showing a conventional RC car power control.

The model tank used in the present invention is radio controlled, and a conventional 2-channel radio control unit as used in FIG. 5, for example, is employed for the radio control. The traveling of the model vehicle is controlled by actuating the left lever, and the turning of the model vehicle is controlled with the right lever. Although not shown in the figures, the model tank in the present invention has a control part 2, e.g. a CPU, that controls the rotational speeds and rotational directions of a motor 10 for traveling and a motor 30 for turning (described later). The model tank further has a receiver that receives control signals transmitted from the radio control unit and that transmits the received control signals to the control part 2, and a storage battery that supplies a power for drive to the traveling motor 10 and the turning motor 30.

The power transmission mechanism according to the present invention is disposed in the body of the model tank. FIGS. 1 and 2 show the power transmission mechanism 1. In FIG. 1, illustration of a gear box 90 that houses the power transmission mechanism 1 is omitted. In FIG. 2, illustration of a gear 12 of the traveling motor 10, a gear 32 of the turning motor 30, and a right sprocket 62 is omitted.

<Forward-Backward Traveling Mechanism> First, a drive mechanism regarding forward-backward traveling in the power transmission mechanism 1 will be explained. The traveling motor 10 is a drive source for forward and backward traveling. The traveling motor 10 is not necessarily limited to a motor but may be an engine or the like.

A traveling motor gear 12 is fixed to a rotating shaft 11 of the traveling motor 10. Members denoted by reference numerals 22 to 29, which will be described below, constitute a first speed-reducing mechanism that reduces the speed of rotation of the traveling motor 10. The traveling motor gear 12 is meshed with a first gear 22. The first gear 22 rotates together with a first bevel gear 23. The first bevel gear 23 is meshed with a second bevel gear 25 rotatably mounted on a first rotating shaft 35. A second gear 26 having a small diameter is disposed at the left side of the second bevel gear 25 so as to rotate together with the second bevel gear 25. The second gear 26 is meshed with a third gear 27 having a large diameter. The third gear 27 is rotatably mounted on a left-inner rotating shaft 43. A fourth gear 28 having a small diameter is disposed at the left side of the third gear 27 so as to rotate together with the third gear 27. The fourth gear 28 is meshed with a fifth gear 29 having a large diameter. The fifth gear 29 is fixed to the first rotating shaft 35.

Thus, the first speed-reducing mechanism comprises the first gear 22, the first bevel gear 23, the second bevel gear 25, the second gear 26, the third gear 27, the fourth gear 28, and the fifth gear 29 and transmits the rotational power of the traveling motor gear 20 to the first rotating shaft 35 after reducing the speed of the rotational power.

A first shaft left-end gear 36 is fixed to the left end of the first rotating shaft 35, and a first shaft right-end gear 37 is fixed to the right end of the first rotating shaft 35 so that the first shaft left-end gear 36 and the first shaft right-end gear 37 rotate together with the first rotating shaft 35. Accordingly, the first shaft left-end gear 36 and the first shaft right-end gear 37 rotate in the same direction and at the same number of revolutions.

The first shaft left-end gear 36 is meshed with a peripheral gear 41 provided on the outer peripheral surface of a left differential gear 40. The first shaft right-end gear 37 is meshed with a peripheral gear 51 provided on the outer peripheral surface of the left differential gear 50. It should be noted that a left-outer rotating shaft 42 projects out leftward from the left side of the left differential gear 40, and a left-inner rotating shaft 43 projects toward the center from the right side of the left differential gear 40. The left-outer rotating shaft 42 and the left-inner rotating shaft 43 are allowed to rotate differentially by the left differential gear 40. Similarly, a right-outer rotating shaft 52 projects out rightward from the right side of the right differential gear 50, and a right-inner rotating shaft 53 projects toward the center from the left side of the right differential gear 50. The right-outer rotating shaft 52 and the right-inner rotating shaft 53 are allowed to rotate differentially by the right differential gear 50.

Further, a left sprocket 61 and a right sprocket 62 of the model tank are fixed to the respective ends of the left-outer rotating shaft 42 and the right-outer rotating shaft 52. The left sprocket 61 and the right sprocket 62 rotate in response to the rotations of the left-outer rotating shaft 42 and the right-outer rotating shaft 52, respectively. The left sprocket 61 and the right sprocket 62 are attached to left and right caterpillars (not shown), respectively. The caterpillars rotate in response to the rotations of the left sprocket 61 and the right sprocket 62, respectively.

The structure of a differential gear will be explained below with reference to FIG. 3. FIG. 3(a) is a perspective view of the left differential gear 40. FIG. 3(b) is an exploded view of the left differential gear 40. The left differential gear 40 has three small bevel gears 48 therein. The small bevel gears 48 are supported in the same plane by a support part 44 having three support rods 44a diverging from the center at an angle of 120° from each other. The small bevel gears 48, which are supported by the support part 44, are held by a left large bevel gear 45 and a right large bevel gear 46 from both sides thereof. The small bevel gears 48 held by the left and right large bevel gears 45 and 46 in this way are housed in a casing 49. A casing cover 47 covers the casing 49 from the side of the right large bevel gear 45 and is screwed to the casing 49. In this way, the components of the left differential gear 40 are integrated together. It should be noted that the distal ends of the support rods 44a of the support part 44 are supported by three recesses 49a, respectively, provided in the casing 49. Accordingly, the support part 44 is integrated with the casing 45 and rotates in response to the rotation of the casing 49.

In addition, the right large bevel gear 46 is provided with a rotating shaft mounting portion 46a. The left-inner rotating shaft 43 is secured to the rotating shaft mounting portion 46a. Thus, the right large bevel gear 46 and the left-inner rotating shaft 43 rotate together as one unit. Meanwhile, the left-outer rotating shaft 42 (not shown) is secured to the left large bevel gear 45, so that the left large bevel gear 45 and the left-outer rotating shaft 42 rotate together as one unit. Accordingly, when the peripheral gear 41, which is integrally formed with the casing 49, rotates, the support part 44 and the support rods 44a rotate together as one unit, and the small bevel gears 48 rotatably mounted on the support rods 44a also rotate. The rotations of the small bevel gears 48 are transmitted to the right large bevel gear 46 and the left large bevel gear 47. At this time, the right large bevel gear 46 and the left large bevel gear 47 rotate in opposite directions.

The rotation transmitted from the peripheral gear 41 in a state where the right large bevel gear 46 is locked is transmitted to the left large bevel gear 45 in the same rotational direction as that of the peripheral gear 41. It should be noted that the left differential gear 40, the right differential gear 50 and the center differential gear 80 have the same internal structure. The center differential gear 80, however, has no peripheral gear. Further, the left differential gear 40 and the right differential gear 50 are positioned in bilateral symmetry as shown in FIGS. 1 and 2. Thus, the differential gear causes the rotating shafts connected to the left and right of the differential gear to rotate differentially in opposite directions. Generally used types of differential gears include a gear differential in which bevel gears are combined in the differential gear as stated above, and a ball differential that uses the rotation of balls. Either type of differential gear is usable.

Next, the operation of the above-described forward-backward traveling mechanism will be explained. The traveling motor 10 is controlled in terms of the forward-reverse rotation, rotational speed, etc. of the motor by the control part 2 in accordance with control signals from the remote control unit (not shown) that are received by the receiver (not shown) provided on the vehicle body.

When a forward-backward traveling signal is received, the traveling motor 10 is controlled, and the rotating shaft 11 of the traveling motor 10 and the traveling motor gear 12 rotate in a predetermined direction.

The rotation of the rotating shaft 11 is transmitted to the first gear 22, causing the first gear 22 and the first bevel gear 23 to rotate. The rotation of the first bevel gear 23 is transmitted to the second bevel gear 25, causing the second bevel gear 25 to rotate together with the second gear 26. The rotation of the second gear 26 is transmitted to the third gear 27, causing the third gear 27 to rotate together with the fourth gear 28. The rotation of the fourth gear 28 is transmitted to the fifth gear 29, causing the fifth gear 29 to rotate together with the first rotating shaft 35. As the first rotating shaft 35 rotates, the first shaft left-end gear 36 and the first shaft right-end gear 37 rotate together with the first rotating shaft 35.

Consequently, the rotational power of the traveling motor 10 is transmitted to the first shaft left-end gear 36 and the first shaft right-end gear 37 after the speed of the rotational power has been reduced to a predetermined rotational speed by the first speed-reducing mechanism, thus causing the first shaft left-end gear 36 and the first shaft right-end gear 37 to rotate in the same direction and at the same number of revolutions.

Further, the rotation of the first shaft left-end gear 36 is transmitted to the peripheral gear 41 of the left differential gear 40 and further transmitted to the left-outer rotating shaft 42 through the differential mechanism of the left differential gear 40. The left sprocket 61 fixed to the left-outer rotating shaft 42 rotates together with the left-outer rotating shaft 42. Similarly, the rotation of the first shaft right-end gear 37 is transmitted to the peripheral gear 51 and further transmitted to the right-outer rotating shaft 52 through the differential mechanism of the right differential gear 50.

The right sprocket 62 rotates together with the right-outer rotating shaft 52. Because the left- and right-outer rotating shafts 42 and 52 rotate in the same direction and at the same number of revolutions, the left sprocket 61 and the right sprocket 62 also rotate in the same direction and at the same number of revolutions. Accordingly, the left and right caterpillars (not shown) also rotate in the same direction and at the same number of revolutions. Thus, the model tank can travel forward or backward with good lateral balance.

It should be noted that the rotational directions of the left- and right-outer rotating shafts 42 and 52 are the same, but the number of revolutions of the rotating shafts 42 and 52 is twice the number of revolutions of the first shaft left-end gear 36 and the first shaft right-end gear 37. This is, however, the case where the left- and right-inner rotating shafts 43 and 53 are locked.

<Turning Mechanism> Next, the turning mechanism of the power transmission mechanism 1 according to the present invention will be explained. The turning motor 30 serves as a drive source for turning the vehicle. The turning motor 30 needs to be controlled in terms of the forward-reverse rotation and rotational speed. Therefore, a motor that is easy to control in terms of these factors is appropriately used as the turning motor 30.

A turning motor gear 32 is fixed to a rotating shaft 31 of the turning motor 30. Members denoted by reference numerals 71 to 79, which will be explained below, constitute a second speed-reducing mechanism that reduces the speed of rotation of the turning motor 30. The turning motor gear 32 is meshed with a sixth gear 71. The sixth gear 71 rotates together with a third bevel gear 72. The third bevel gear 72 is meshed with a fourth bevel gear 73 rotatably mounted on the first rotating shaft 35. A seventh gear 74 having a small diameter is disposed at the left side of the fourth bevel gear 73 so as to rotate together with the fourth bevel gear 73.

The seventh gear 74 is meshed with an eighth gear 75 having a large diameter. The eighth gear 75 is rotatably mounted on the right-inner rotating shaft 53. A ninth gear 76 having a small diameter is disposed at the left side of the eighth gear 75 so as to rotate together with the eighth gear 75. The ninth gear 76 is meshed with a tenth gear 77 having a large diameter that is rotatably mounted on the first rotating shaft 35. An eleventh gear 78 having a small diameter is disposed at the left side of the tenth gear 77 so as to rotate together with the tenth gear 77. The eleventh gear 78 is meshed with a twelfth gear 79 having a large diameter. The twelfth gear 79 is fixed to the right-inner rotating shaft 53.

Thus, the second speed-reducing mechanism comprises the sixth gear 71, the third bevel gear 72, the fourth bevel gear 73, the seventh gear 74, the eighth gear 75, the ninth gear 76, the tenth gear 77, the eleventh gear 78 and the twelfth gear 79 and transmits the rotational power of the turning motor 30 to the right-inner rotating shaft 53 after reducing the speed of the rotational power.

The rotation of the right-inner rotating shaft 53 is transmitted to the center differential gear 80 from the right side of the center differential gear 80. The center differential gear 80 converts the rotation input thereto from the right-inner rotating shaft 53 at the right side thereof to a rotation in the opposite direction and transmits it to the left-inner rotating shaft 43 at the left side thereof.

The rotation of the left-inner rotating shaft 43 is transmitted to the left differential gear 40 from the right side thereof. The left differential gear 40 converts the rotation input thereto from the left-inner rotating shaft 43 to a rotation in the opposite direction and transmits it to the left-outer rotating shaft 42 at the left side thereof. A left sprocket 61 is fixed to the left-outer rotating shaft 42.

Meanwhile, the rotation of the right-inner rotating shaft 53 transmitted from the second speed-reducing mechanism is transmitted to the right differential gear 50 from the left side of the right differential gear 50. The right differential gear 50 converts the rotation input thereto from the right-inner rotating shaft 53 to a rotation in the opposite direction and transmits it to the right-outer rotating shaft 52 at the left side thereof. A right sprocket 62 is fixed to the right-outer rotating shaft 52.

Next, the operation of the above-described turning mechanism will be explained. The rotation of the turning motor 30 is transmitted to the turning motor gear 32 through the rotating shaft 31. The rotation of the turning motor gear 32 is transmitted to the sixth gear 71, causing the sixth gear 71 to rotate together with the third bevel gear 72. The rotation of the third bevel gear 72 is transmitted to the fourth bevel gear 73, causing the fourth bevel gear 73 to rotate together with the seventh gear 74. The rotation of the seventh gear 74 is transmitted to the eighth gear 75. The rotation of the eighth gear 75 is transmitted to the ninth gear 76. The rotation of the ninth gear 76 is transmitted to the tenth gear 77. The rotation of the tenth gear 77 is transmitted to the eleventh gear 78. The rotation of the eleventh gear 78 is transmitted to the twelfth gear 79. The right-inner rotating shaft 53 rotates together with the twelfth gear 79.

The following is an explanation of the conversion of the rotational direction by the differential gears 40, 50 and 80. In the following explanation, the rotation of the right-inner rotating shaft 53 is assumed to be clockwise.

The clockwise rotation of the right-inner rotating shaft 53 is input to the center differential gear 80 from the right side of the center differential gear 80. The center differential gear 80 converts the input rotation to a counterclockwise rotation and transmits it to the left-inner rotating shaft 43. The counterclockwise rotation of the left-inner rotating shaft 43 is input to the left differential gear 40 from the right side of the left differential gear 40. The left differential gear 40 converts the counterclockwise rotation to a clockwise rotation and transmits it to the left-outer rotating shaft 42. The left sprocket 61 rotates clockwise together with the left-outer rotating shaft 42.

Meanwhile, the clockwise rotation of the right-inner rotating shaft 53 is input to the right differential gear 50 from the left side of the right differential gear 50. The right differential gear 50 converts the input rotation to a counterclockwise rotation and transmits it to the right-outer rotating shaft 52. The right sprocket 62 rotates counterclockwise together with the right-outer rotating shaft 52. Accordingly, the left sprocket 61 rotates clockwise, while the right sprocket 62 rotates counterclockwise.

If the turning motor 30 is rotated with the traveling motor 10 suspended, a spin turn can be made. That is, the vehicle body turns in place without traveling either forward or backward. If the turning motor 30 is rotated while the traveling motor 10 is in operation, the rotational numbers of the left and right sprockets 61 and 62 can be changed while the rotational directions thereof remain the same. Accordingly, the vehicle body can be turned slowly leftward or rightward.

To make a pivot turn, for example, the rotational force transmitted from the traveling motor 10 to the left-outer rotating shaft 42 and the rotational force transmitted from the turning motor 30 to the left-outer rotating shaft 42 are controlled so that the numbers of revolutions are the same but the rotational directions are opposite to each other. Consequently, the rotation of the left-outer rotating shaft 42 is stopped, while the right-outer rotating shaft 52 is rotated at a speed twice as high as that of the rotational force transmitted from the traveling motor 10. That is, the rotational force from the traveling motor 10 and that from the turning motor 30 are transmitted to the right-outer rotating shaft 52 in the same direction and at the same number of revolutions. Therefore, the total number of revolutions of rotational forces transmitted to the right-outer rotating shaft 52 is double the number of revolutions of rotational force so far transmitted thereto from the traveling motor 10. In this case, the left sprocket 61 stops, but only the right sprocket 62 rotates. Consequently, the vehicle body can make a pivot turn. It should be noted that if the rotational direction of the turning motor 30 is made opposite to the above, a pivot turn of the vehicle body can be made in such a manner that the right sprocket 62 stops, while only the left sprocket 61 rotates.

The invention claimed is:

1. A power transmission mechanism for use in a model vehicle, comprising:
   a drive unit for traveling providing a drive force for traveling to said model vehicle;
   a first rotating shaft to which the drive force of said drive unit for traveling is transmitted;
   a first differential gear and a second differential gear to which the rotation of said first rotating shaft is transmitted;
   a first wheel rotated by said first differential gear;
   a second wheel rotated by said second differential gear;
   a drive unit for turning providing a drive force for turning to said model vehicle;
   a second rotating shaft to which the drive force of said drive unit for turning is transmitted;
   a third differential gear to which the rotation of said second rotating shaft is transmitted;
   a third rotating shaft transmitting the rotation transmitted from said third differential gear to said first differential gear; and
   a control part controlling the rotations of said drive unit for traveling and said drive unit for turning;
   wherein said third differential gear transmits the rotation transmitted from said second rotating shaft to said third rotating shaft through differential rotation, and said first differential gear transmits the rotation transmitted from said third rotating shaft to said first wheel through differential rotation, and wherein said second rotating shaft transmits the rotation transmitted from said drive unit for turning to said second differential gear, and said second differential gear transmits the rotation transmitted from said second rotating shaft to said second wheel through differential rotation.

2. A power transmission mechanism according to claim 1, wherein when said model vehicle is to travel in a straight line, said control part drives said drive unit for traveling and stops said drive unit for turning.

3. A power transmission mechanism according to claim 1, wherein when said model vehicle is to make a slow turn, said control part drives said drive unit for traveling and, at a same time, drives said drive unit for turning, thereby producing a difference in number of revolutions of left- and right-side wheels.

4. A power transmission mechanism according to claim 3, wherein when said slow turn is to be made, rotations in a same direction are applied from said drive unit for traveling and said drive unit for turning to either one of said first differential gear and said second differential gear to increase the number of revolutions of either one of said first wheel and said second wheel, and at a same time, rotations in opposite directions to each other are applied from said drive unit for traveling and said drive unit for turning to the other of said first differential gear and said second differential gear to reduce the number of revolutions of the other of said first wheel and said second wheel.

5. A power transmission mechanism according to claim 1, wherein when said model vehicle is to make a pivot turn, said control part drives said drive unit for traveling and said drive unit for turning at predetermined numbers of revolutions, thereby stopping rotation of either one of said first wheel and said second wheel and rotating the other of said first wheel and said second wheel.

6. A power transmission mechanism according to claim 5, wherein when said pivot turn is to be made, rotations of said drive unit for traveling and said drive unit for turning are applied to either one of said first differential gear and said second differential gear at a same number of revolutions but in opposite directions, thereby stopping rotation of either one of said first wheel and said second wheel.

7. A power transmission mechanism according to claim 1, wherein when said model vehicle is to make a spin turn, said control part stops said drive unit for traveling and drives said drive unit for turning, thereby rotating said first wheel and said second wheel in opposite directions.

8. A power transmission mechanism according to claim 7, wherein when said spin turn is to be made, rotation of said drive unit for turning is applied to either one of said first differential gear and said second differential gear to rotate either one of said first wheel and said second wheel, and at a same time, rotation of said drive unit for turning is applied to the other of said first differential gear and said second differential gear at a same number of revolutions as that of the rotation applied to said one of said first differential gear and said second differential gear but in an opposite direction to that of said rotation, thereby rotating the other of said first wheel and said second wheel in an opposite direction to that of rotation of said one of said first wheel and said second wheel.

9. A power transmission mechanism according to claim 1, further comprising:

a first speed-reducing mechanism that transmits rotation of said drive unit for traveling to said first rotating shaft after reducing speed of said rotation.

10. A power transmission mechanism according to claim 1, further comprising:

a second speed-reducing mechanism that transmits rotation of said drive unit for turning to said second rotating shaft after reducing speed of said rotation.

11. A power transmission mechanism according to claim 1, further comprising:

a first rotating shaft left gear that transmits rotation of said first rotating shaft to said first differential gear; and a first rotating shaft right gear that transmits rotation of said first rotating shaft to said second differential gear.

12. A power transmission mechanism according to claim 11, further comprising:

a first differential gear peripheral gear which is provided on said first differential gear and to which rotation of said first rotating shaft left gear is transmitted; and a second differential gear peripheral gear which is provided on said second differential gear and to which rotation of said first rotating shaft right gear is transmitted.

13. A power transmission mechanism according to claim 12, wherein said first wheel rotates in a same direction as said first differential gear peripheral gear, and said second wheel rotates in a same direction as said second differential gear peripheral gear.

14. A power transmission mechanism according to claim 1, wherein said model vehicle is a tracked vehicle.

* * * * *